United States Patent
Chiang

(10) Patent No.: US 10,203,251 B2
(45) Date of Patent: Feb. 12, 2019

(54) TEMPERATURE DETECTING CIRCUIT

(71) Applicant: Winbond Electronics Corp., Taichung (TW)

(72) Inventor: Ju-An Chiang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 350 days.

(21) Appl. No.: 15/054,148

(22) Filed: Feb. 26, 2016

(65) Prior Publication Data

US 2017/0160145 A1 Jun. 8, 2017

(30) Foreign Application Priority Data

Dec. 4, 2015 (CN) .......................... 2015 1 0887196

(51) Int. Cl.
*G01K 7/01* (2006.01)
*H03K 5/003* (2006.01)
*G05F 1/46* (2006.01)

(52) U.S. Cl.
CPC .............. *G01K 7/01* (2013.01); *G05F 1/468* (2013.01); *H03K 5/003* (2013.01)

(58) Field of Classification Search
CPC ..................................................... G01K 7/01
See application file for complete search history.

(56) References Cited

U.S. PATENT DOCUMENTS

| 6,876,250 B2 | 4/2005 | Hsu et al. | |
| 6,888,397 B2 * | 5/2005 | Tsuchiya | G01K 7/01 327/512 |

(Continued)

FOREIGN PATENT DOCUMENTS

| CN | 1517687 | 8/2004 |
| CN | 102419609 | 4/2012 |

(Continued)

OTHER PUBLICATIONS

"Office Action of Taiwan Counterpart Application", dated Jun. 21, 2016, p. 1-p. 6.

(Continued)

*Primary Examiner* — Clayton E Laballe
*Assistant Examiner* — Leon W Rhodes, Jr.
(74) *Attorney, Agent, or Firm* — JCIPRNET

(57) ABSTRACT

A temperature detecting circuit is provided. The temperature detecting circuit includes a band gap voltage generating circuit and an offset adjusting circuit. The band gap voltage generating circuit generates a reference voltage according to a bias voltage. The band gap voltage generating circuit has a voltage dividing circuit, and the voltage dividing circuit divides the reference voltage to generate a plurality of output voltages. The offset adjusting circuit includes a current source and a resistor string. The current source provides a reference current. The resistor string receives the reference current and generates a plurality of adjusted output voltage accordingly. At least one of a current value of the reference current and a resistance of each of the resistor units is provided to be adjusted to force a voltage on an output terminal of the current source to be substantially equal to one of the reference voltage and the output voltages.

12 Claims, 7 Drawing Sheets

(56) References Cited

U.S. PATENT DOCUMENTS

| | | | | |
|---|---|---|---|---|
| 6,934,645 B2* | 8/2005 | Kim | ................ | G01K 3/005 |
| | | | | 219/481 |
| 7,204,638 B2* | 4/2007 | Hsu | ................ | G01K 7/01 |
| | | | | 327/513 |
| 7,532,056 B2* | 5/2009 | Seo | ................ | G01K 7/00 |
| | | | | 323/907 |
| 7,565,258 B2* | 7/2009 | Duarte | ................ | G01K 3/005 |
| | | | | 307/117 |
| 7,809,519 B2* | 10/2010 | Sinha | ................ | G01K 7/015 |
| | | | | 702/99 |
| 7,821,321 B2 | 10/2010 | Zimlich | | |
| 7,901,134 B2 | 3/2011 | Sudo | | |
| 7,978,000 B2 | 7/2011 | Zimlich | | |
| 9,587,994 B2* | 3/2017 | Yayama | ................ | G01K 15/005 |
| 2009/0323764 A1 | 12/2009 | Im | | |
| 2011/0032023 A1 | 2/2011 | Tanaka | | |

FOREIGN PATENT DOCUMENTS

| | | |
|---|---|---|
| CN | 103698054 | 4/2014 |
| JP | 2005017139 | 1/2005 |
| TW | 200641337 | 12/2006 |

OTHER PUBLICATIONS

"Office Action of China Counterpart Application", dated Oct. 16, 2018, p. 1-p. 9.

* cited by examiner

TEMPERATURE DETECTING CIRCUIT

CROSS-REFERENCE TO RELATED APPLICATION

This application claims the priority benefit of China application serial no. 201510887196.5, filed on Dec. 4, 2015. The entirety of the above-mentioned patent application is hereby incorporated by reference herein and made a part of this specification.

BACKGROUND OF THE INVENTION

1. Field of the Invention

The invention relates to a temperature detecting circuit, and more particularly, to a temperature detecting circuit capable of compensating an offset of a reference voltage.

2. Description of Related Art

In modern integrated circuits, for various applications, a temperature detecting circuit is often required to be disposed in chips. For example, the temperature detecting circuit can be used to detect whether temperature is overly high in order to activate overheat protection mechanism for circuit to thereby ensure work performance of the circuit.

In the conventional technical field, a temperature independent reference voltage is usually used while temperature dependent circuit elements are disposed in the circuit. Electric property parameters of the temperature dependent elements may include a positive temperature coefficient or may also include a negative temperature coefficient instead. A temperature at the time may be detected by comparing the electric property parameters (e.g., voltages) which change with temperature variation as provided by said circuit elements with the temperature independent reference voltage.

However, referring to FIG. 1, which is a waveform diagram of a temperature detection in prior art. In the conventional technical field, an offset within a specific range (e.g., a range represented by dash lines) may occur on a reference voltage Vref, and the same condition may also occur on voltages V1 to V3 provided by the temperature dependent circuit elements. Accordingly, certain errors may occur on a comparison result of the reference voltage Vref and the voltages V1 to V3, resulting in an inaccurate temperature detection.

SUMMARY OF THE INVENTION

The invention is directed to a temperature detecting circuit, which is capable of compensating errors caused by offset occurred on a reference voltage that serves as a baseline.

The temperature detecting circuit of the invention includes a band gap voltage generating circuit and an offset adjusting circuit. The band gap voltage generating circuit generates a reference voltage according to a bias voltage. The band gap voltage generating circuit has a voltage dividing circuit, and the voltage dividing circuit divides the reference voltage to generate a plurality of output voltages. The offset adjusting circuit is coupled to the band gap voltage generating circuit. The offset adjusting circuit includes a current source and a resistor string. The current source provides a reference current. The resistor string is coupled to an output terminal of the current source, and has a plurality of resistor units connected in series. The resistor string receives the reference current and generates a plurality of adjusted output voltage accordingly. At least one of a current value of the reference current and a resistance of each of the resistor units is provided to be adjusted to force a voltage on an output terminal of the current source to be substantially equal to one of the reference voltage and the output voltages.

Based on the above, at least one of the current value of the reference current and the resistances of the resistor units is provided to be adjusted in the invention. Accordingly, when the offset is generated due to various factors, the errors occurred on a temperature detection may be effectively compensated to improve an accuracy of the temperature detection.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
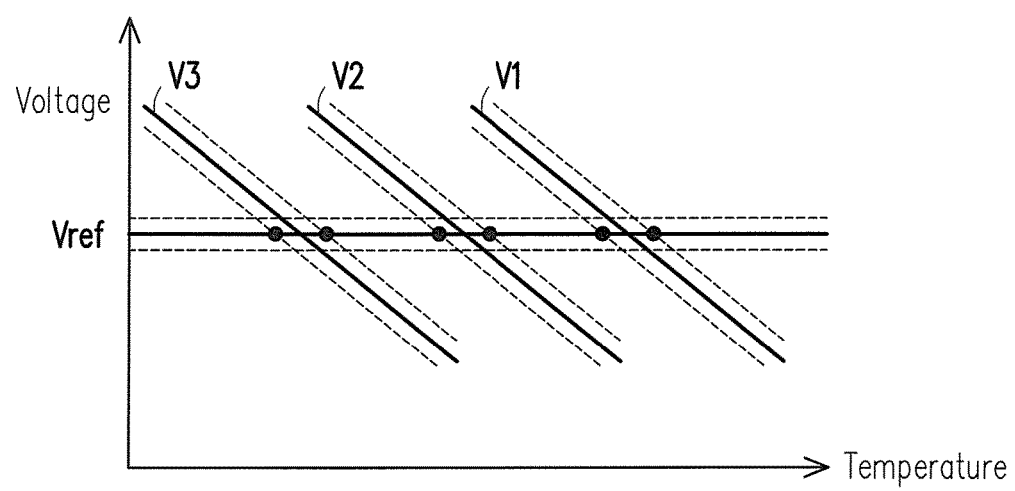
FIG. 1 is a waveform diagram of a temperature detection in prior art.

Reference will now be made in detail to the present preferred embodiments of the invention, examples of which are illustrated in the accompanying drawings. Wherever possible, the same reference numbers are used in the drawings and the description to refer to the same or like parts.

Figure 2:
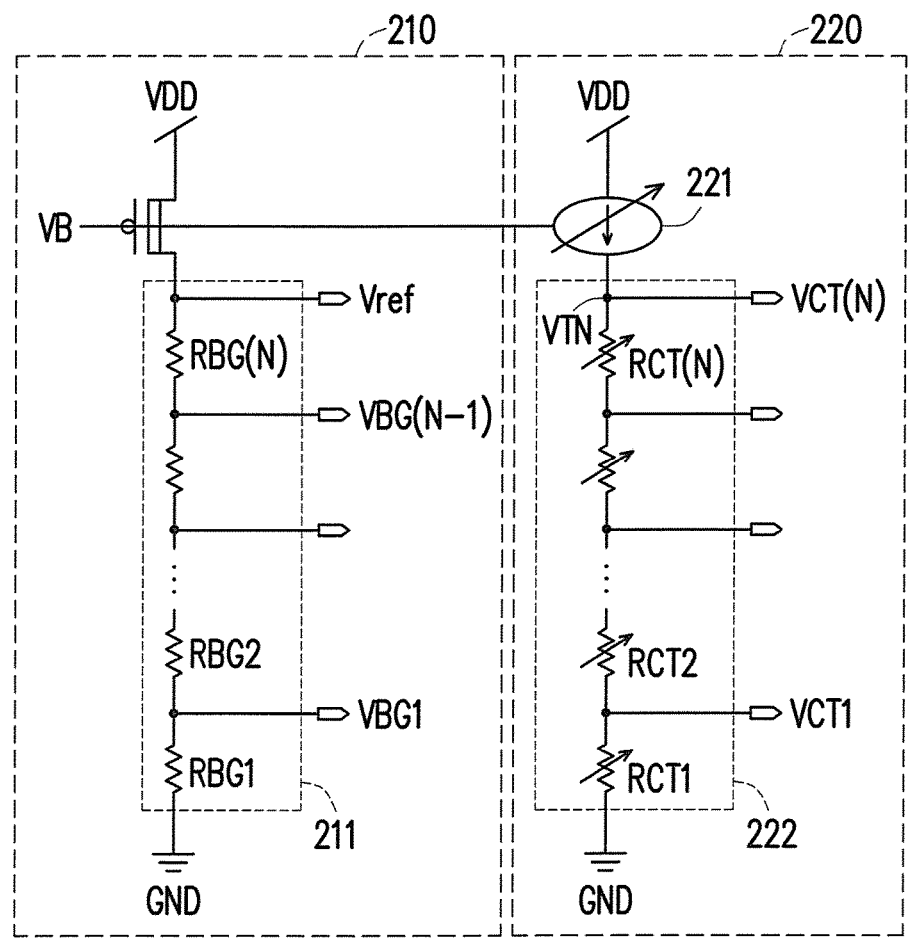
FIG. 2 illustrates a schematic diagram of a temperature detecting circuit in an embodiment of the invention.

Referring to FIG. 2, FIG. 2 illustrates a schematic diagram of a temperature detecting circuit in an embodiment of the invention. A temperature detecting circuit 200 includes a band gap voltage generating circuit 210 and an offset adjusting circuit 220. The band gap voltage generating circuit 210 generates a reference voltage Vref according to a bias voltage VB. The band gap voltage generating circuit 210 has a voltage dividing circuit 211. The voltage dividing circuit 211 receives the reference voltage Vref, and divides the reference voltage Vref to generate a plurality of output voltages VBG1 to VBG(N−1).

In the present embodiment, the voltage dividing circuit 211 includes a plurality of resistor units RBG1 to RBG(N). Among them, the resistor units RBG(N) to RBG1 are sequentially connected in series between a terminal of the band gap voltage generating circuit 210 for generating the reference voltage Vref and a reference ground terminal GND.

On the other hand, the offset adjusting circuit 220 is coupled to the band gap voltage generating circuit 210. The offset adjusting circuit 220 includes a current source 221 and a resistor string 222. Herein, the current source 221 generates a reference current according to the bias voltage VB. The resistor string 222 is coupled to an output terminal of the current source 221 to receive the reference current provided by the current source 221. The resistor string 222 is constituted a plurality of resistor units RCT1 to RCT(N) connected in series. Herein, the resistor string 222 generates adjusted output voltages VCT1 to VCT(N) on nodes where adjacent two of the resistor units RCT1 to RCT(N) are coupled to each other according to the received reference voltage. Temperature on the chip at the time may be accurately detected by comparing the adjusted output voltages VCT1 to VCT(N) with a preset standard value.

It should be noted that, in the present embodiment, at least one of a current value of the reference current provided by the current source 221 and resistances of the resistor units RCT1 to RCT(N) is adjustable. Further, when the offset occurs on the reference voltage Vref, a voltage VTN on a node of the resistor string 222 coupling to the current source 221 may be adjusted by adjusting at least one of the current value of the reference current provided by the current source 221 and the resistances of the resistor units RCT1 to RCT(N) to force the voltage VTN to be substantially equal to at least one of the reference voltage Vref and the output voltage VBG1 to VBG(N−1). Accordingly, errors caused by the offset of the reference voltage Vref may be compensated.

In the present embodiment, related operations for adjusting the current value of the reference current provided by the current source 221 and the resistances of the resistor units RCT1 to RCT(N) may all be completed by applying a trim technique. In other words, the operations of compensation for the temperature detecting circuit 200 may be completed simply by using one single trim operation in the embodiments of the invention.

Figure 3:
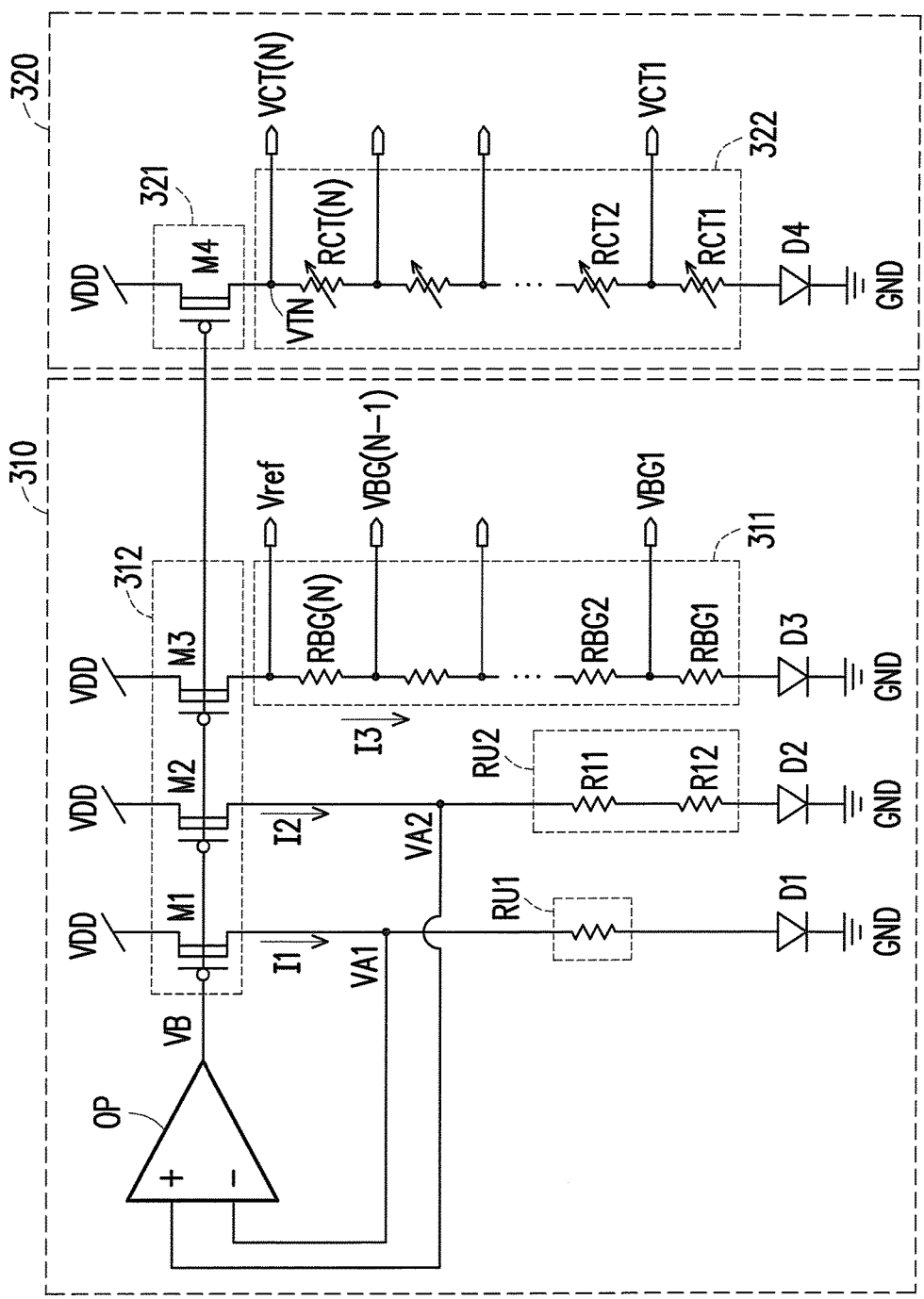
FIG. 3 illustrates a schematic diagram of a temperature detecting circuit in another embodiment of the invention.

Referring to FIG. 3, FIG. 3 illustrates a schematic diagram of a temperature detecting circuit in another embodiment of the invention. A temperature detecting circuit 300 includes a band gap voltage generating circuit 310 and an offset adjusting circuit 320. The band gap voltage generating circuit 310 includes a voltage dividing circuit 311, a current generator 312, an operational amplifier OP, reference resistors RU1 and RU2 and diodes D1 to D3. In the operational amplifier OP, positive and negative input terminals receive voltages VA1 and VA2 respectively, and an output terminal generates a bias voltage VB. The current generator 312 is coupled to the operational amplifier OP and receives the bias voltage VB. The current generator 312 generates currents I1 to I3 according to the bias voltage VB.

The reference resistors RU1 and RU2 are connected between the current generator 312 and a reference ground terminal GND in series to receive the currents I1 and I2, respectively. Nodes via which the reference resistors RU1 and RU2 are coupled to the current generator 312 generate voltage VA1 and VA2, respectively, by the currents I1 and I2. The reference resistor RU2 is formed by two resistors R11 and R12 connected in series. A resistance of the resistor R11 may be identical to a resistance of the reference resistor RU1. In other words, a resistance of the reference resistor RU2 is greater than the resistance of the reference resistor RU1. Further, anodes of the diodes D1 and D2 receive the currents I1 and I2, respectively. Cathodes of the diodes D1 and D2 are coupled to the reference ground terminal GND.

The current I3 is provided to the voltage dividing circuit 311, and a reference voltage Vref is generated by a node of the voltage dividing circuit 311 coupling to the current generator 312. The voltage dividing circuit 311 is further coupled to an anode of the diode D3, and a cathode of the diode D3 is coupled to the reference ground terminal. The voltage dividing circuit 311 includes a plurality of resistor units RBG1 to RBG(N) connected in series. The voltage dividing circuit 311 divides the reference voltage Vref to generate a plurality of output voltages VBG1 to VBG(N−1).

Further, in the present embodiment, the current generator 312 includes transistors M1 to M3. Herein, first terminals of the transistors M1 to M3 receive a power voltage VDD; control terminals of the transistors M1 to M3 receive the bias voltage VB; and second terminals of the transistors M1 to M3 generate the currents I1, I2 and I3, respectively.

On the other hand, the offset adjusting circuit 320 includes a current source 321, a resistor string 322 and a diode D4. The resistor string 322 includes a plurality of resistor units RCT1 to RCT(N) connected in series. The current source 321 receives the power voltage VDD and receives the bias voltage VB in order to generate the reference current according to the bias voltage VB. The reference current is transmitted to the resistor string 322, in which resistances of the resistor units RCT1 to RCT(N) are adjustable to generate adjusted output voltages VCT1 to VCT(N).

The current source 321 includes a transistor M4. Herein, the transistor M4 has a first terminal which receives the power voltage VDD, a second terminal which is coupled to the resistor string 322 and a control terminal which receives the bias voltage VB.

With regard to details in the operations, in the present embodiment, the reference voltage Vref may be expressed by an equation (1) below:

$$Vref = Vf + VT*\ln(Q)*1/R12*(RBG1 + RBG2 + \ldots + RBG(N)) \quad (1)$$

Herein, Vf is a turn on voltage of the diode D1; Q is a channel area ratio of the diodes D2 and D1; and VT is a thermal voltage.

In view of the equation (1), the reference voltage Vref includes the item $(VT*\ln(N)*1/R12*(RBG1+RBG2+ \ldots +RBG(N))$ which is proportional to temperature and the item Vf which is inversely proportional to temperature. Therefore, it can be known that, the reference voltage Vref is less associated with temperature variation.

According to the equation (1), the output voltages VBG1 to VBG(N−1) may be calculated, as shown by an equation (2):

$$VBG1 = Vf + VT*\ln(Q)*1/R12*(RBG1) \quad (2)$$

$$VBG2 = Vf + VT*\ln(Q)*1/R12*(RBG1 + RBG2)$$

$$\vdots$$

$$VBG(N-1) =$$

$$Vf + VT*\ln(Q)*1/R12*(RBG1 + RBG2 + \ldots + RBG(N-1))$$

The output voltages VBG1 to VBG(N−1) are voltages inversely proportional to temperature variation. The output voltages are voltages which can be used for the temperature detection.

The offset can occur on the reference Vref when there are errors in a match proportional relation between the currents I2 and I3. In such case, voltage values of the output voltages VBG1 to VBG(N−1) in the equation (2) are also changed correspondingly, and the condition after changing is shown by an equation (3) below:

$$VBG1' = Vf + VT*\ln(Q)*1/R12*(RBG1') \quad (3)$$

-continued $$VBG2' = Vf + VT*\ln(Q)*1/R12*(RBG1' + RBG2')$$

$$\vdots$$

$$VBG(N-1)' =$$
$$Vf + VT*\ln(Q)*1/R12*(RBG1' + RBG2' + \ldots + RBG(N-1)')$$

In the equation (3) above, the resistance RBGx' of each of the resistor units may be re-written as equal to RBGx+ΔR. Herein, when ΔR is a positive value, it indicates that the reference voltage Vref is a positive value. Conversely, when ΔR is a negative value, it indicates that the reference voltage Vref is a negative value.

In the offset adjusting circuit 320, when the offset occurs on the reference voltage Vref, a highest adjusted output voltage VCT(N) may be expressed by an equation (4) below:

$$VCT(N)'=Vf+VT*\ln(Q)*1/R12*(RCT1+RCT2+\ldots+RCT(N)+N*\Delta R) \quad (4)$$

In view of the equation (4), it is clear that when the resistance of the resistor unit satisfies the relation of RBGx=RCTx+ΔR, the reference voltage Vref is equal to the voltage VTN. Moreover, an accurate temperature detecting may be effectively achieved accordingly.

In other words, in the present embodiment, the voltage offset occurred on the reference voltage Vref may be compensated while ensuring the accuracy of the temperature detection simply by adjusting the resistance of each of the resistor units RCT1 to RCT(N) and forcing the reference voltage Vref to be substantially equal to one of the voltage VTN and the output voltages VBG1 to VBG(N−1).

Figure 4:
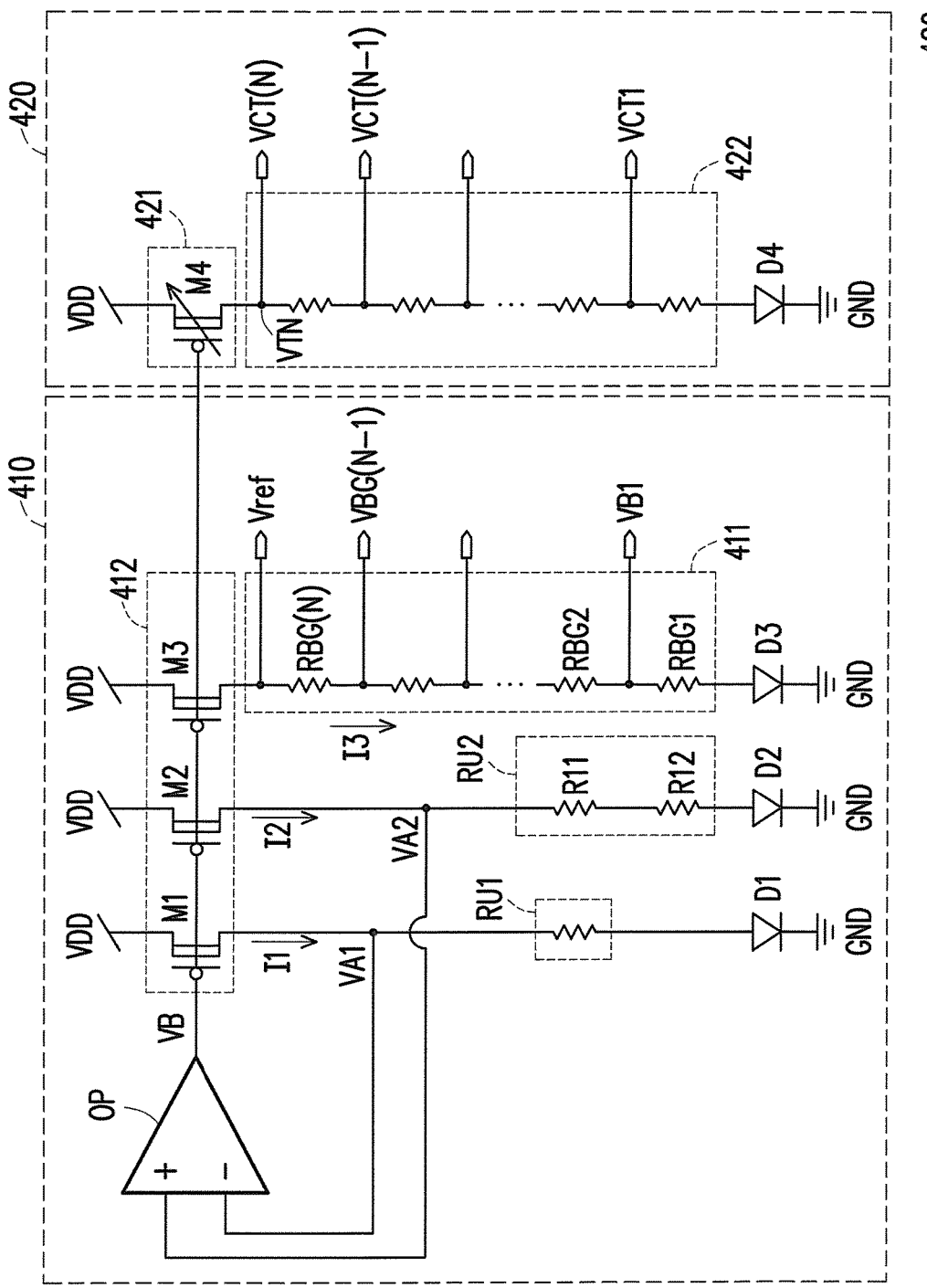
FIG. 4 illustrates a schematic diagram of a temperature detecting circuit in yet another embodiment of the invention.

Referring to FIG. 4, FIG. 4 illustrates a schematic diagram of a temperature detecting circuit in yet another embodiment of the invention. A temperature detecting circuit 400 includes a band gap voltage generating circuit 410 and an offset adjusting circuit 420. The band gap voltage generating circuit 410 includes a voltage dividing circuit 411, a current generator 412, an operational amplifier OP, reference resistors RU1 and RU2 and diodes D1 to D3. The offset adjusting circuit 420 includes a current source 421 and a resistor string 422. Unlike the embodiment of FIG. 3, the offset of the reference voltage Vref is compensated by adjusting a magnitude of a current value of a reference current provided by the current source 421 in the present embodiment. In the present embodiment, the current source 421 is a variable current source, in which an effective width length ratio of a channel of a transistor M41 is adjustable to thereby adjust the current value of the generated reference current. Further, the offset of the reference voltage Vref may be compensated while ensuring the accuracy of the temperature by adjusting the current value of the reference current to force the voltage VTN to be substantially equal to one of the reference voltage Vref and the output voltages VBG1 to VBG(N−1).

Naturally, the present embodiment may be implemented together with the embodiment of FIG. 3. That is to say, the reference current generated by the current source 421 and the resistances of the resistor units in the resistor string 422 may all be adjusted at the same time in stead of adjusting only one of the current source 421 and the resistor string 422.

Figure 5:
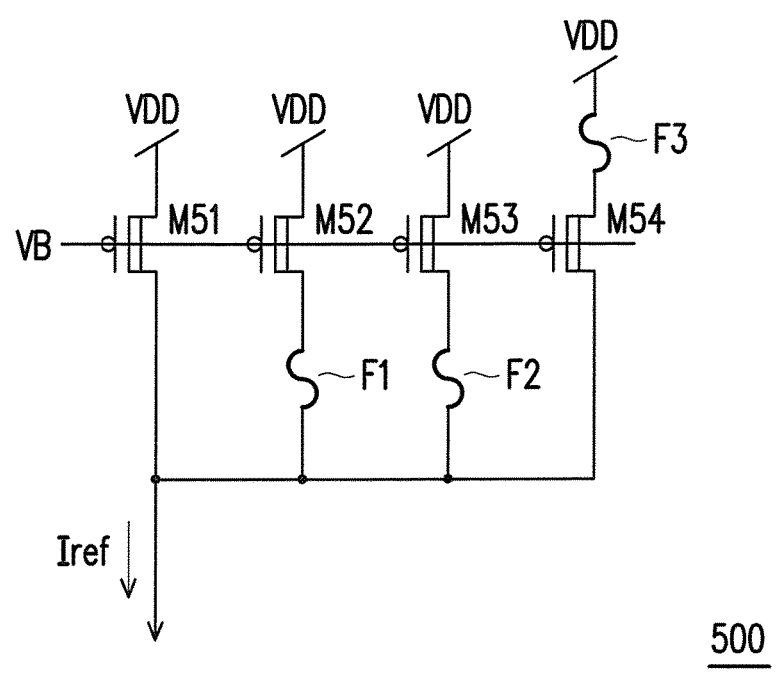
FIG. 5 illustrates an implementation of the current source in the offset adjusting circuit according to embodiments of the invention.

Referring to FIG. 5, FIG. 5 illustrates an implementation of the current source in the offset adjusting circuit according to embodiments of the invention. In FIG. 5, a current source 500 in the offset adjusting circuit includes a transistor M51, auxiliary transistors M52 to M54 and fuse units F1 to F3. The transistor M51 has a first terminal which is coupled to a power voltage VDD, another terminal which generates a reference current Iref and a control terminal which receives a bias voltage VB. Control terminals of the auxiliary transistors M52 to M54 commonly receive the bias voltage VB. First terminals of the auxiliary transistors M52 and M53 directly receive the power voltage VDD, and second terminals of the auxiliary transistors M52 and M53 are coupled to a second terminal of the transistor M51 via the fuse units F1 and F2, respectively. In addition, the auxiliary transistor M54 has a first terminal which is coupled to the power voltage VDD via the fuse unit F3 and a second terminal which is directly connected to the second terminal of the transistor M51.

In this implementation, a magnitude of the current value of the reference current Iref may be adjusted through whether to blow the fuse units F1 to F3. Herein, when the fuse units F1 to F3 are intact without being blown, the current value of the reference current Iref is at the maximum. Conversely, when the fuse units F1 to F3 are blown, the current value of the reference current Iref is at the minimum.

Further, a number of the auxiliary transistors is not particularly limited. Relations among width length ratios of channels of the auxiliary transistors M52 to M54 are not particularly limited either, and the width length ratios of the channels of the auxiliary transistors M52 to M54 may be identical or different.

With regard to the implementation for blowing the fuse units F1 to F3, any technical means well known by person skilled in the art may be applied in the present application without specific limitations.

Figure 6A:
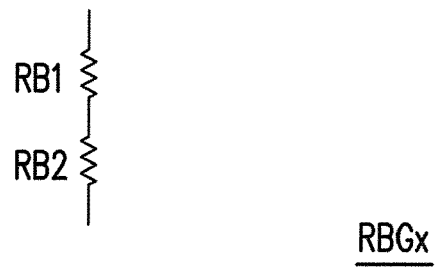
FIG. 6A to FIG. 6C illustrate implementations of the resistor unit according to embodiments of the invention.
Figure 6B:
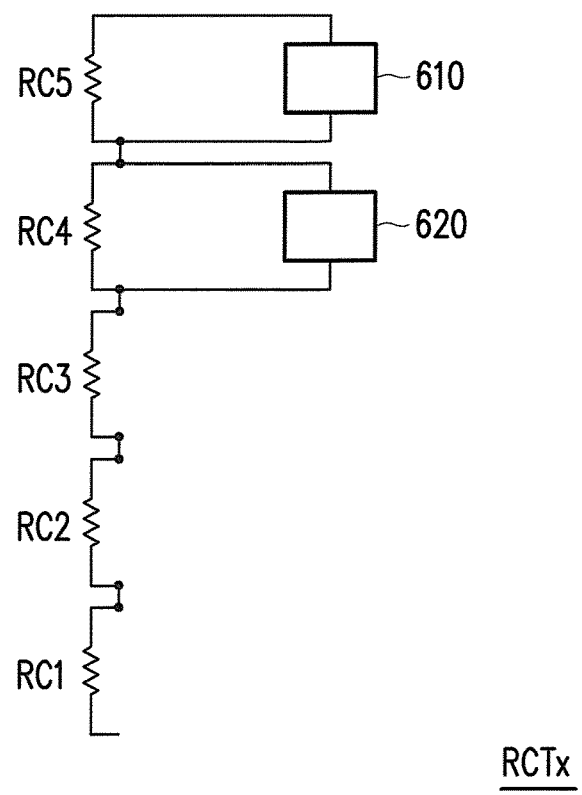
Figure 6C:
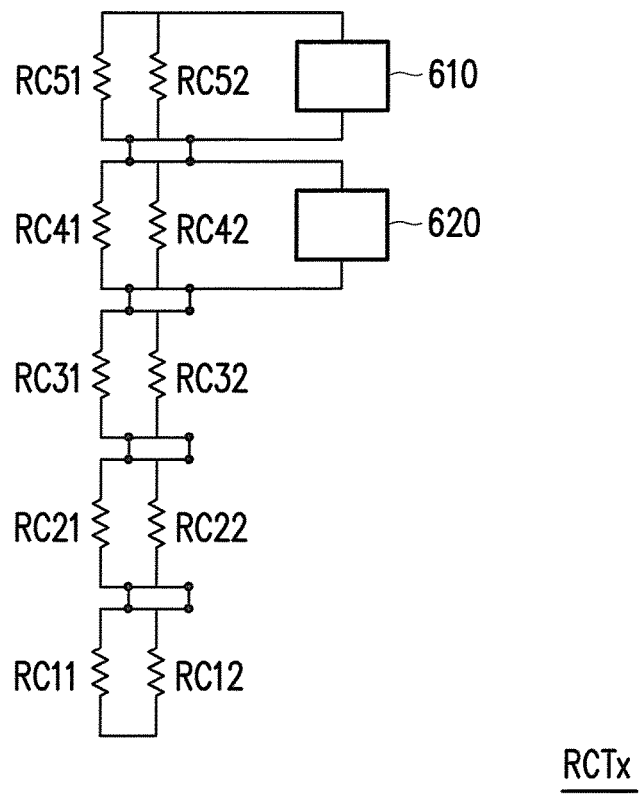

Hereinafter, referring to FIG. 6A to FIG. 6C, FIG. 6A to FIG. 6C illustrate implementations of the resistor unit according to embodiments of the invention. FIG. 6A illustrates a schematic diagram of the implementation of a resistor unit RGBx for constituting the voltage dividing circuit in the band gap voltage generating circuit, in which the resistor unit RGBx is constituted by including a plurality of unit resistors RB1 and RB2 connected in series. Resistances of the unit resistors RB1 and RB2 may be identical. In the present embodiment, the resistance of the resistor unit RGBx may be fixed, whereas a number of the unit resistors included in the resistor unit RGBx is not particularly limited.

Further, FIG. 6B illustrates a schematic diagram of a resistor unit RCTx for constituting the resistor string in the offset adjusting circuit. The resistor unit RCTx includes a plurality of unit resistors RC1 to RC5 connected to each other in series, and also includes one or more fuse units 610 and 620. In this implementation, the unit resistors RC4 and RC5 are to-be-adjusted resistors. The fuse units 610 and 620 are coupled to the unit resistors RC4 and RC5 respectively. More specifically, an end of the fuse unit 610 is coupled to an end of the unit resistor RC4, and another end of the fuse unit 610 is coupled to another end of the unit resistor RC4. Similarly, an end of the fuse unit 620 is coupled to an end of the unit resistor RC5, and another end of the fuse unit 620 is coupled to another end of the unit resistor RC5.

A resistance of the resistor unit RCTx may be adjusted by whether to blow the fuse units 610 and 620. When the fuse units 610 and 620 are not blown, a resistance of the resistor unit RCTx is equal to a total of resistances of the unit resistors RC1 to RC3. In case the fuse unit 610 is blown but the fuse unit 620 is not blown, the resistance of the resistor unit RCTx is equal to a total of the resistances of the unit resistors RC1 to RC3 and RC5; In case the fuse unit 620 is blown but the fuse unit 610 is not blown, the resistance of the resistor unit RCTx is equal to a total of the resistances of the unit resistors RC1 to RC4; and in case the fuse units 610 and 620 are both blown, the resistance of the resistor unit RCTx is equal to a total of the resistances of the unit resistors RC1 to RC5.

Herein, the resistances of the unit resistors RC1 to RC5 may be identical, and may also be identical to or different from each of resistances of the unit resistors RB1 and RB2.

Furthermore, FIG. 6C illustrates a schematic diagram of another implementation of the resistor unit RCTx for constructing the resistor string in the offset adjusting circuit. Unit resistors RC11, RC21, RC31, RC41 and RC51 are connected to each other in series, and each of the unit resistors RC11, RC21, RC31, RC41 and RC51 may be connected to respective one of unit resistors RC12, RC22, RC32, RC42 and RC52 in parallel. The fuse units 610 and 620 are connected to the unit resistors RC51 and RC41 in parallel, respectively. When resistances of the unit resistors RC11 to RC52 are identical to each of resistances of the unit resistors RB1 and RB2, if one of the fuse units 610 and 620 is blown while another is not blown, the resistance of the resistor unit RCTx may be identical to the resistance of the resistor unit RBGx.

It should be noted that, the implementations of the resistor unit as illustrated in FIG. 6A to FIG. 6C are merely exemplary examples. In fact, there are various implementations for resistor units with fixed resistance and resistor units with adjustable resistance well known by person skill in the art, which are all applicable on the present invention. The invention is not intended to limit the related implementations.

In summary, the invention replicates the voltage dividing circuit in the band gap voltage generating circuit to create the offset adjusting circuit and compensate the reference voltage by adjusting the reference current generated by the current source or the resistance of each resistor unit in the resistor string, or adjusting the reference current generated by the current source and the resistance of each resistor unit in the resistor string at the same time. As a result, in the temperature generating circuit, mismatch generated from various factors may be effectively compensated to improve the accuracy of the temperature detecting.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A temperature detecting circuit, comprising:
   a band gap voltage generating circuit generating a reference voltage according to a bias voltage, the band gap voltage generating circuit having a voltage dividing circuit, the voltage dividing circuit dividing the reference voltage to generate a plurality of output voltages; and
   an offset adjusting circuit coupled to the band gap voltage generating circuit, and comprising:
   a current source providing a reference current; and
   a resistor string coupled to an output terminal of the current source and having a plurality of resistor units connected in series, the resistor units receiving the reference current and generating a plurality of adjusted output voltages,
   wherein at least one of a current value of the reference current and a resistance of each of the resistor units is provided to be adjusted to force a voltage on the output terminal of the current source to be substantially equal to one of the reference voltage and the output voltages,
   wherein each of the resistor units further comprises:
   at least one fuse unit, wherein an end of the fuse unit is coupled to an end of a to-be-adjusted resistor among a plurality of unit resistors of each of the resistor units, and another end of the fuse unit is coupled to another end of the to-be-adjusted resistor.

2. The temperature detecting circuit of claim 1, wherein the current source comprises:
   a transistor having a first terminal receiving a power voltage, a second terminal coupled to the resistor string and a control terminal receiving the bias voltage.

3. The temperature detecting circuit of claim 2, wherein the current source further comprises:
   at least one auxiliary transistor having a first terminal receiving the power voltage, a second terminal coupled to the resistor string and a control terminal receiving the bias voltage; and
   at least one fuse unit, connected in series between paths via which the auxiliary transistor receives the power voltage or connected in series between paths via which the auxiliary transistor is coupled to the resistor string, wherein the fuse unit is turned off or turned on to adjust a magnitude of the current value provided by the current source.

4. The temperature detecting circuit of claim 1, wherein the plurality of unit resistors connected to each other in series, and resistances of the unit resistors are identical.

5. The temperature detecting circuit of claim 1, wherein the offset adjusting circuit further comprises:
   a diode having a cathode coupled to a reference ground voltage and an anode coupled to the resistor string.

6. The temperature detecting circuit of claim 1, wherein the band gap voltage generating circuit further comprises:
   an operational amplifier having a negative input terminal receiving a first voltage, a positive input terminal receiving a second voltage and an output terminal generating the bias voltage;
   a current generator coupled to the operational amplifier and the voltage dividing circuit, receiving the bias voltage, and generating a first current, a second current and a third current according to the bias voltage, wherein the third current is provided to the voltage dividing circuit; and
   a first reference resistor connected between the current generator and a reference ground terminal in series, and receiving the first current to generate the first voltage; and
   a second reference resistor connected between the current generator and the reference ground terminal series, and receiving the second current to generate the second voltage,
   wherein a resistance of the first reference resistor is less than a resistance of the second reference resistor.

7. The temperature detecting circuit of claim 6, wherein the band gap voltage generating circuit further comprises:
   a first diode having a cathode coupled to a reference ground voltage and an anode coupled to the first reference resistor;
   a second diode having a cathode coupled to the reference ground voltage and an anode coupled to the second reference resistor; and
   a third diode having a cathode coupled to the reference ground voltage and an anode coupled to the voltage dividing circuit.

8. The temperature detecting circuit of claim 6, wherein the second reference resistor comprises:
- a first resistor having a first terminal coupled to the current generator;
- a second resistor having a first terminal coupled to a second terminal of the first resistor, a second terminal of the second resistor being coupled to the reference ground terminal,
- wherein a resistance of the first resistor is identical to the resistance of the first reference resistor.

9. The temperature detecting circuit of claim 6, wherein the current generator comprises:
- a first transistor having a first terminal receiving a power voltage, a second terminal generating the first current and a control terminal receiving the bias voltage;
- a second transistor having a first terminal receiving the power voltage, a second terminal of the second transistor generating the second current, a control terminal of the second transistor receiving the bias voltage; and
- a third transistor having a first terminal receiving the power voltage, a second terminal of the third transistor generating the third current, a control terminal of the third transistor receiving the bias voltage.

10. The temperature detecting circuit of claim 1, wherein voltage values of the reference voltages do not change with temperature variation, and the output voltages and the adjusted output voltages have a negative temperature coefficient.

11. The temperature detecting circuit of claim 1, wherein the voltage dividing circuit comprises a plurality of resistor units connected in series.

12. The temperature detecting circuit of claim 11, wherein each of the resistor units is formed by a plurality of unit resistors connected in series.

* * * * *